US005396455A

United States Patent [19]
Brady et al.

[11] Patent Number: 5,396,455
[45] Date of Patent: Mar. 7, 1995

[54] MAGNETIC NON-VOLATILE RANDOM ACCESS MEMORY

[75] Inventors: Michael J. Brady, Brewster; Richard J. Gambino, Yorktown Heights; Lia Krusin-Elbaum, Dobbs Ferry; Ralph R. Ruf, New City, all of N.Y.

[73] Assignee: International Business Machines Corporation, Armonk, N.Y.

[21] Appl. No.: 56,038

[22] Filed: Apr. 30, 1993

[51] Int. Cl.$^6$ .............................................. G11C 11/18
[52] U.S. Cl. ..................................... 365/170; 365/171; 365/9; 365/2; 365/173
[58] Field of Search ................... 365/170, 171, 2, 185, 365/9

[56] References Cited

U.S. PATENT DOCUMENTS

| | | | |
|---|---|---|---|
| 3,521,255 | 7/1970 | Arndt | 340/174 |
| 3,701,126 | 10/1972 | Reichard | 340/174 M |
| 3,736,578 | 5/1973 | Masuda | 340/174 HA |
| 3,835,376 | 9/1974 | Kataoka | 324/43 R |
| 4,238,837 | 12/1980 | DeLuca et al. | 365/28 |
| 4,739,264 | 4/1988 | Kamiya et al. | 324/251 |
| 4,875,011 | 10/1989 | Namiki et al. | 324/251 |
| 5,025,416 | 6/1991 | Prinz | 365/170 |
| 5,068,826 | 11/1991 | Matthews | 365/170 |
| 5,075,247 | 12/1991 | Matthews | 437/52 |
| 5,089,991 | 2/1992 | Matthews | 365/9 |
| 5,107,460 | 4/1992 | Matthews | 365/122 |
| 5,289,410 | 2/1994 | Katti et al. | 365/170 |
| 5,329,480 | 7/1994 | Wu et al. | 365/170 |

OTHER PUBLICATIONS

E. C. Cox, "Hall switch operation over two wires," New Electron (GB) vol. 12 No. 18 (1979).
R. B. Laibowitz et al "Field-Effect Transistor Magnetic Bubble-Domain System" IBM Tech. Disclosure Bull. vol. 17, 3074 (1975).
J. D. DeLuca et al "Observation of a Domain Drag Effect in Amorphous GdCoMo Films" IEEE Trans. on Magnetics vol. MAG-14, 500 (1978).
J. C. DeLuca et al, "Bias Field dependence of domain drag propagation velocities in GdCoAu bubble films," J. Appl Phys. 52, 6168 (1981).
A. V. Pohm et al, "Threshold properties of 1, 2 and 4 $\mu$m Multilayer Magneto-Resistive Memory Cells," IEEE Trans on Magnetics vol. MAG-23, 2575 (1987).
C. S. Comstock et al "Perturbation to the Stoner-Wohlforth threshold in 2×20 $\mu$m M-R Memory elements," J. Appl. Phys. 63, 4321 (1988).
A. V. Pohm et al, "The Design of a One Megabit Non-Volatile M-R Memory Chip Using 1.5×5 $\mu$m Cells," IEEE Trans. on Magnetics 24, 3117 (1988).
J. DeBoeck et al, "Non-Volatile Memory Characteristics of sub-micrometre Hall structures fabricated in epitaxial ferromagnetic MnAl films on GaAs" Electron Lett (UK) vol. 29, No. 4, 18 Feb. 1993 p. 421.

Primary Examiner—Eugene R. LaRoche
Assistant Examiner—Huan Hoang
Attorney, Agent, or Firm—Robert M. Trepp

[57] ABSTRACT

A non-volatile random access memory is described incorporating a plurality of memory cells, each memory cell having a Hall effect device including amorphous magnetic material and a switch for directing current through the flail effect device. An array of memory cells are interconnected by word lines, current lines, and bit lines. The invention overcomes the problem of a rugged non-volatile random access memory with long term reliability.

11 Claims, 2 Drawing Sheets

MAGNETIC NON-VOLATILE RANDOM ACCESS MEMORY

BACKGROUND OF THE INVENTION

1. Field of the Invention

This invention relates to magnetic random access memories, and more particularly, to a two-dimensional array of Hall elements comprised or amorphous magnetic materials.

2. Description of the Prior Art

A non-volatile memory is a memory which holds the data during an interruption or after the power has been cut off. There are many examples of non-volatile memories such as direct access storage devices (DASD) which utilizes a disk having a magnetic layer thereon for storing data which is sensed by a read head which produces a voltage in response to the magnetic field intercepting the read head.

Hall devices are used to measure magnetic fields and consist of a semiconductor bar with current passing in one direction, the magnetic field orthogonal thereto, and a voltage across the bar orthogonal to the current and to the magnetic field.

In U.S. Pat. No. 5,089,991 which issued on Feb. 18, 1992, to J.A. Matthews entitled, "Non-Volatile Memory Cell", a non-volatile memory cell is described incorporating a magnetic patch which stores data in the form of a magnetic field and a Hall effect sensor for reading the stored data from the magnetic patch.

In U.S. Pat. No. 4,238,837 which issued on Dec. 9, 1980 to DeLuca et al., a magnetic bubble device is described comprising a magnetic bubble domain material which propagates magnetic bubble domains by means of the domain drag effect, the velocity of propagation of a magnetic bubble varies as a function of the current density through the material.

There exists today a need for a rugged non-volatile random access memory (NVRAM) with long term reliability for consumer products, portable computers and other electronic systems such as for the military.

SUMMARY OF THE INVENTION

In accordance with the present invention, a non-volatile random access memory is described comprising a two-dimensional array of Hall effect devices, each Hall effect device is connected to a word line, a current line and a bit line, the connection to the current line is through the source and drain of a transistor, the word line is coupled to the gate of the transistor, the magnetic state of the Hall effect device is sensed by measuring the voltage on the bit line when a current is passed through the Hall effect device by activating the current line and turning on the transistor by a voltage waveform on the word line. The Hall effect device may be made of a thin film of a material with a large spontaneous Hall effect.

BRIEF DESCRIPTION OF THE DRAWINGS

These and other features, objects, and advantages of the present invention will become apparent upon a consideration of the following detailed description of the invention which read in conjunction with the drawing, in which.

DESCRIPTION OF THE PREFERRED EMBODIMENT

Figure 1:
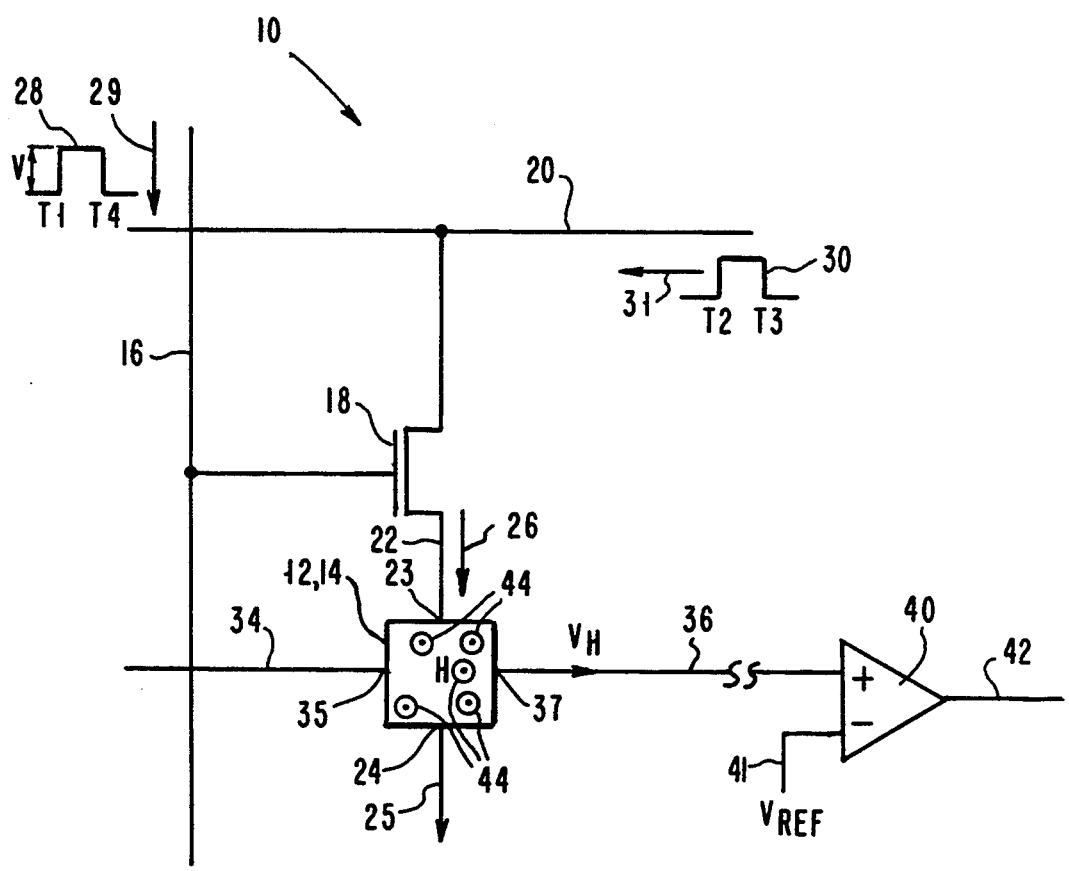
FIG. 1 is one embodiment of the invention.

Referring to the drawing, and in particular FIG. 1, a memory cell 10 is shown. Memory cell 10 has a four terminal Hall effect device 12. Hall effect device may comprise amorphous magnetic materials 14 containing rare earth and transition metals such as Gd-Tb-Fe-Co which exhibit both a large anomalous Hall coefficient ($4 \times 10^{-6}$ ohm-cm) and perpendicular anisotropy. Amorphous magnetic materials 14 may be adjusted in composition to give a square magnetization loop and high magnetization remanance.

The Hall effect device may be made of doped semiconductor material and may be provided with an adjacent square magnetization loop magnetic material which provides a magnetic field at the Hall device. Memory cell 10 is suitable for inserting into a grid or a two-dimensional array having a plurality of word lines and a plurality of bit lines wherein the word lines are orthogonal to the bit lines. As shown in FIG. 1, word line 16 is coupled to the gate of MOS transistor 18 having its drain coupled to current line 20. The source of MOS transistor 18 is coupled over lead 22 to terminal 23 of Hall effect device 12. The other side of Hall effect device 12 has terminal 24 which is coupled to ground potential. Hall effect device 12 conducts current frown terminal 23 through amorphous magnetic material 14 to terminal 24. MOS transistor 18 functions as a switch at times an appropriate voltage is on lead 16 to cause transistor 18 to be conducting to pass current from lead 20 through MOS transistor 18 through Hall effect device 12 to ground potential. Arrow 26 shows the direction of current. Word line 16 may have a positive going voltage V shown by waveform 28 which exceeds the threshold voltage of, MOS transistor 18 in order to cause MOS transistor 18 to be conducting at times waveform 28 has a voltage V. Waveform 28 travels down word line 16 in the direction shown by arrow 29. Waveform 30, which represents current, travels down current line 20 as shown by arrow 31. Waveform 30 should occur concurrently with waveform 28 or during waveform 28 so that MOS transistor 18 is conducting. For example, waveform 28 may have a leading edge at T1 and a trailing edge at T4 shown in FIG. 1. Waveform 30 may have a leading edge at time T2 and a trailing edge at time T3 wherein T1, T2, T3 and T4 are each later in time.

Bit line 34 may be connected to terminal 35 of Hall effect device 12. Bit line 36 may be coupled to terminal 37 on the opposite side from terminal 35. Bit lines 34 and 36 sense the voltage across Hall effect device 12 at terminals 35 and 37. Bit line 36 is coupled to a positive input of, amplifier 40 which may be, for example, a differential amplifier. A second input of amplifier 40 may be coupled over lead 41 to a reference voltage $V_{REF}$. The output of amplifier 40 is coupled to lead 42 which provides an indication of the data stored in the selected Hall effect device, i.e. selected by current passing therethrough shown by arrow 26 in FIG. 1. Amplifier 40 may function as a comparator.

The magnetization of Hall effect device 12 may be set or reversed by thermal cycling in an applied magnetic field. As shown in FIG. 1, the magnetization H is shown by reference numeral 44 with the magnetization or the magnetic field perpendicular and pointing upwards to the upper surface of Hall effect device 12. The other magnetization state for Hall effect device 12 is with the magnetic field 180° opposite and pointing downwards with respect to the upper surface of Hall effect device 12.

Figure 2:
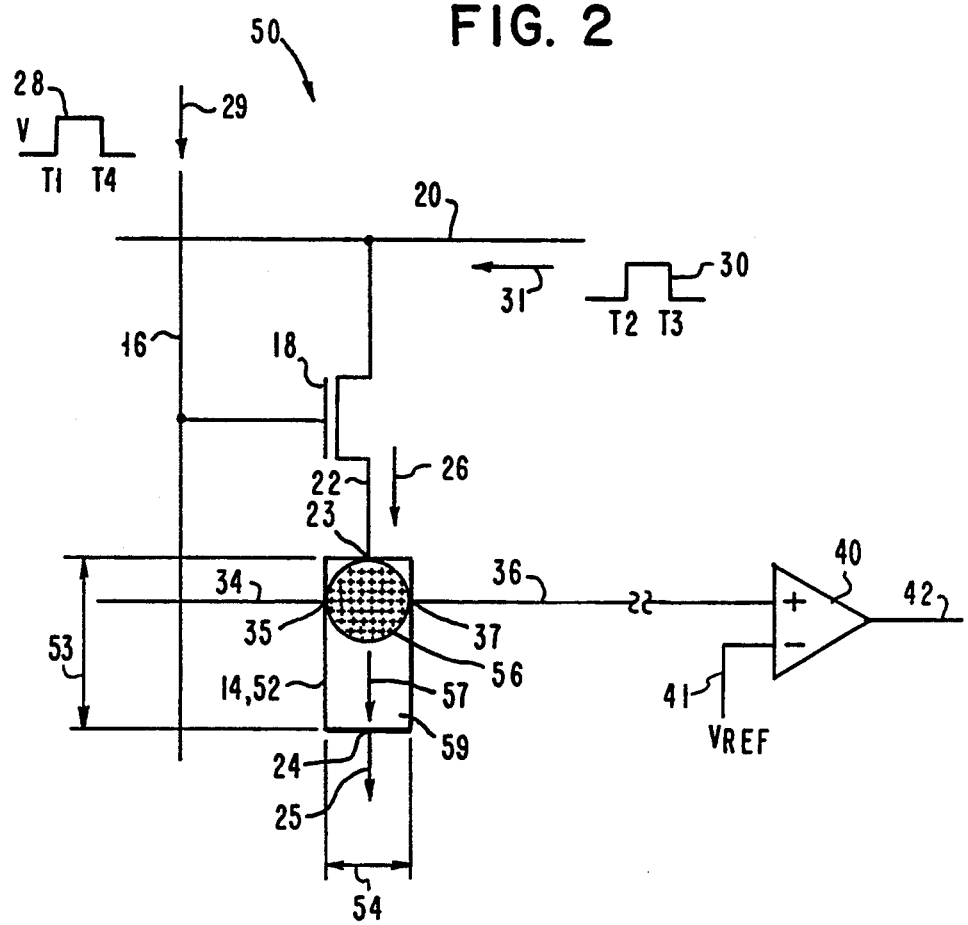
FIG. 2 is an alternate embodiment of the invention.

Referring to FIG. 2, memory cell 50 is shown with Hall effect device 52. In FIG. 2, like references are used for functions corresponding to the apparatus of FIG. 1. Hall effect device 52 may be made of amorphous magnetic materials 14. Hall effect device 52 has a length shown by arrow 53 greater than its width shown by arrow 54. A magnetic domain or bubble 56 is formed in amorphous magnetic material 14 in Hall effect device 52. Magnetic domain 56 may be moved as shown by arrow 57 by the drag effect of current shown by arrow 26 and back by reversing the current. Thus, magnetic domain 56 may be magnetized in one direction typically up or down with respect to the magnetization of amorphous magnetic material 14 outside of magnetic domain 56 shown by reference numeral 59. If amorphous magnetic material 14 is magnetized down in magnetic domain 56, the magnetization in amorphous magnetic material 59 is magnetized up. By moving magnetic domain 56 to a position between terminals 35 and 37 or to a position so that magnetic domain 59 is not between terminals 35 and 37, binary information may be stored in memory cell 50. The length of Hall effect device 52 should be sufficient to allow magnetic domain 56 to move completely away from terminals 35 and 37.

Figure 3:
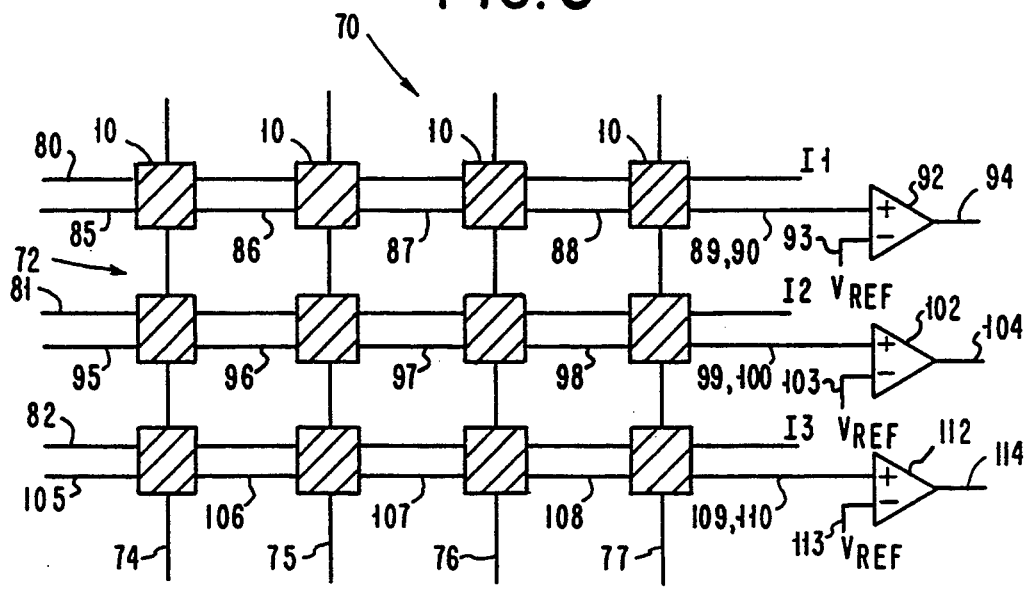
FIG. 3 shows a random access memory using the embodiment of FIGS. 1 and 2.

Referring to FIG. 3, a random access memory 70 is shown comprising memory cells 10 formed in an array 72. In FIG. 3, like references are used for functions corresponding to the apparatus of FIG. 1. Word lines 74 through 77 are continuous conducting lengths. Each word line is coupled to three memory cells 10 and corresponds to word line 16 in FIG. 1. Current lines 80 through 82 each couple through four memory cells 10 and correspond to current line 20 at each memory cell 10 shown in FIG. 1. Current lines 80, 81 and 82 are continuous conducting lengths. Leads 85 through 89 form bit line 90 which is coupled to the positive input of amplifier 92. Amplifier 92 has a negative input coupled over lead 93 to a reference voltage. Amplifier 92 has an output coupled over lead 94. Leads 88 and 89 correspond to, for example, bit lines 34 and 36 shown in FIG. 1. Leads 95 through 99 interconnect four memory cells to Form bit line 100 which is coupled to the positive input of amplifier 102. A negative input of amplifier 102 is coupled over lead 103 to a reference voltage $V_{REF}$. The output of amplifier 102 is coupled over lead 104. Leads 98 and 99 correspond to, for example, bit lines 34 and 36 in FIG. 1. Leads 105 through 109 interconnect Four memory cells 10 to form bit line 110 which is coupled to the positive input of amplifier 112. A negative input of amplifier 112 is coupled over lead 113 to reference voltage $V_{REF}$. The output of amplifier 112 is coupled over lead 114. FIG. 3 shows a two-dimensional array 72 of memory cells 10 to form a non-volatile random access memory (NVRAM). The Hall effect device used in memory cell 10 may be 10 microns wide with MOS transistor 18 fabricated into the cell to provide a cell density of 4 megabits per square cm. In FIG. 3, any memory cell may be addressed by activating the appropriate word and current line. Each current line, when selected, may provide both read and write currents to memory cell 10 and the bit lines sense the Hall voltage across the selected memory cell 10. The voltage polarity across Hall effect device 12 in memory cell 10 depends on the direction of magnetization in Hall effect device 12 (up or down).

In read operation, any memory cell 10 can be read by decoding the appropriate word and current line. A selected word line may have a voltage equal to $V_{dd}+V_{th}$ where $V_{dd}$ is the supply voltage and $V_{th}$ is the threshold voltage. The selected word line will have a voltage sufficient to turn on transistor 18 and allow a Hall current to pass through Hall effect device 12 in memory cell 10. The current shown by arrow 26 in FIG. 1 produces a positive or negative Hall voltage $V_H$ on the bit line depending on the direction of the magnetization of amorphous magnetic material 14 in Hall effect device 12. The bit line is sensed by amplifier 40 which may be a comparator. While the bit line passes through many memory cells, only the selected memory cell having current shown by arrow 26 would provide a Hall voltage $V_H$ on the bit line at the input of amplifier 40 shown in FIG. 1 or bit line 90 coupled to the input of amplifier 92 shown in FIG. 3.

The Hall voltage can be given according to equation 1.

$$V_H = 8 \times 10^{-6} (J_H \times W) \tag{1}$$

In equation 1, $V_H$ is equal to the Hall voltage (volts); $J_H$ is equal to the Hall current density (amps/sq cm); W is equal to the width of Hall element (cm). Typical values of $J_H$ is $5 \times 10^5$ amps/cm$^2$ and W is equal to 10 microns to give a 4 mv Hall voltage.

In write operation of memory cell 10 in FIG. 3, the bits are written by applying a current pulse shown by arrow 26 in FIG. 1 very similar to the read mode. There are two ways to write a bit in memory cell 10, or reverse the magnetization in amorphous magnetic material 14 in Hall effect device 12. One way is to heat the amorphous magnetic material 14 by a current pulse to either its Curie temperature or well above its compensation point where a small external magnetic field can reverse the direction of magnetization. The temperature rise in degrees centigrade for short pulses can be approximated by equation 2.

$$T = 1.67(J^2 \times R \times t) \tag{2}$$

In equation 2, T is equal to the temperature rise (C), J is equal to current density (Amps/cm$^2$), R is equal to resistivity (ohm cm), and t is equal to pulse duration (seconds). Typical values are: $J = 5 \times 10^5$ $R = 200 \times 10^{-6}$ and $t = 2 \times 10^{-6}$ which give a 160 C. temperature rise in amorphous magnetic material 14. The temperature rise is confined to the high resistivity ($R = 200 \times 10^{-6}$) amorphous magnetic material 14 in Hall effect device 12. Shorter duration pulses where t is less than $2 \times 10^{-7}$ sec or a slightly lower current density ($J^2$) would be used for reading where heating is not desirable.

In the write operation of memory cell 50, a current pulse is used to drag a single magnetic bubble domain 56 (area of reverse magnetization) along the direction of the Hall effect device also known as domain drag. The magnetic domain 56 is formed earlier by applying heat in a spot and a magnetic field. In memory cell 50, the presence or absence of magnetic domain 56 across terminals 35 and 37 would cause a reversal of the magnetization of amorphous magnetic material 14. Typical current densities for domain drag are $3 \times 10^6$ amps/cm$^2$ resulting in magnetic domain 56 (bubble) velocities of 100 meters/sec. Therefore, to move a magnetic domain 56 ten microns, 20 current pulses of 50 nanoseconds duration and a 50% duty cycle would be applied for a total time of $2\times10^{-6}$ seconds. The series of short pulses are needed to prevent heating which would occur with one long pulse. The write time to write data in memory cell 10 by heating or in memory cell 50 by domain drag is comparable or about the same.

A non-volatile random access memory has been described which is extremely rugged since it has no moving parts. The data retention of the non-volatile random access memory described herein is expected to be better than magneto-resistive memory arrays because the coercivities of amorphous magnetic material 14 are a factor of 1,000 higher.

A non-volatile random access memory has been described comprising a two-dimensional array of Hall effect devices, each Hall effect device is connected to a word line, a current line, and a bit line, the connection to the current line is through a switch, the word line is coupled to the control input of the switch, the magnetic state of the Hall effect device is sensed by measuring the voltage on the bit line when a current is passed through the selected Hall effect device by activating the current line and turning on the switch by a voltage on the word line.

The invention further describes a memory cell having a shaped Hall effect device such as rectangular wherein a magnetic domain or bubble is moved between or away from the Hall voltage terminals on either side of the Hall effect device by domain drag.

While there has been described and illustrated a non-volatile random access memory cell incorporating a Hall effect device, it will be apparent to those skilled in the art that modifications and variations are possible without deviating from the broad scope of the invention which shall be limited solely by the scope of the claims appended hereto.

Having thus described our invention, what we claim as new and desire to secure by Letters Patents is:

1. A non-volatile random access memory comprising:
   a two dimensional array of Hall effect devices arranged in a plurality of rows and columns,
   each said Hall effect device having first and second spaced apart terminals for connecting in series with a current line,
   each said Hall effect device having third and fourth spaced apart terminals for connecting in series with a bit line,
   each Hall effect device in a respective column connected to a word line, each Hall effect device in a respective row connected in a respective current line and a respective bit line,
   the connection of each Hall effect device in a respective current line is through a switch, the word line is coupled to the control input of said switch,
   the magnetic state of the Hall effect device is sensed by measuring the voltage on the bit line when a current is passed through the Hall effect device by activating the current line and turning on the switch by a voltage on the word line.

2. The memory of claim 1 wherein said 1 Hall effect device is made of a thin film of a material exhibiting a large spontaneous Hall effect.

3. The memory of claim 1 wherein said Hall effect device is made of a magnetic material with a square magnetization loop and high remanence.

4. The memory of claim 1 wherein said Hall effect device is made of an amorphous magnetic material with perpendicular anisotropy.

5. The memory of claim 1 wherein said Hall effect device is made of a magnetic bubble material.

6. The memory of claim 1 wherein said Hall effect device is made of a doped semiconductor material and is provided with an adjacent square magnetization loop magnetic material which provides a magnetic field at the Hall device.

7. The memory of claim 1 wherein the magnetic state of the Hall effect device is written thermomagnetically.

8. The memory of claim 1 wherein the magnetic state of the Hall effect device is written by moving a magnetic bubble by means of a current pulse through the domain Hall effect device.

9. The memory of claim 1 wherein the magnetic state of the Hall effect device is read by applying a voltage on the word line of sufficient magnitude to turn on the switch, whereby the resulting current through the Hall effect device will produce a positive or negative Hall effect voltage on said bit line depending on magnetic state of the Hall device.

10. The memory of claim 9 wherein said bit line is coupled to one input of a comparator.

11. The memory of claim 1 wherein said switch is a MOS transistor.

* * * * *